(12) United States Patent
Kim et al.

(10) Patent No.: US 11,011,731 B2
(45) Date of Patent: May 18, 2021

(54) FILM FOR PREVENTING HUMIDITY FROM PERCOLATION AND METHOD FOR MANUFACTURING THE SAME

(71) Applicant: JUSUNG ENGINEERING CO., LTD., Gwangju-si (KR)

(72) Inventors: Kyeong Min Kim, Gwangju-si (KR); Bong Sik Kim, Gwangju-si (KR); Sang Du Lee, Gwangju-si (KR); Won Tae Cho, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 11 days.

(21) Appl. No.: 16/476,253

(22) PCT Filed: Jan. 2, 2018

(86) PCT No.: PCT/KR2018/000019
§ 371 (c)(1),
(2) Date: Jul. 5, 2019

(87) PCT Pub. No.: WO2018/128344
PCT Pub. Date: Jul. 12, 2018

(65) Prior Publication Data
US 2019/0355934 A1 Nov. 21, 2019

(30) Foreign Application Priority Data
Jan. 5, 2017 (KR) .......................... 10-2017-0002003

(51) Int. Cl.
*H01L 51/52* (2006.01)
*C23C 16/34* (2006.01)
(Continued)

(52) U.S. Cl.
CPC ........ *H01L 51/5256* (2013.01); *C23C 16/345* (2013.01); *C23C 16/402* (2013.01); *H01L 51/56* (2013.01)

(58) Field of Classification Search
CPC ... H01L 51/56; H01L 51/5256; C23C 16/345; C23C 16/402
(Continued)

(56) References Cited

U.S. PATENT DOCUMENTS

2006/0226517 A1* 10/2006 Iwanaga ............. H01L 51/5253
257/639
2007/0026243 A1* 2/2007 Iwanaga ............... C23C 16/545
428/446
(Continued)

FOREIGN PATENT DOCUMENTS

KR 20050029789 A 3/2005
KR 20110101518 A 9/2011
(Continued)

*Primary Examiner* — Igwe U Anya
(74) *Attorney, Agent, or Firm* — Renaissance IP Law Group LLP

(57) ABSTRACT

The present inventive concept provides a moisture prevention film including: a first moisture prevention film; a second moisture prevention film formed on the first moisture prevention film; and a third moisture prevention film formed on the second moisture prevention film, wherein a concentration of oxygen (O) of the second moisture prevention film is higher than a concentration of oxygen of each of the first moisture prevention film and the third moisture prevention film, a method of manufacturing the moisture prevention film, and an organic light emitting device including the moisture prevention film.

16 Claims, 5 Drawing Sheets

(51) Int. Cl.
*C23C 16/40* (2006.01)
*H01L 51/56* (2006.01)

(58) Field of Classification Search
USPC .......................................................... 257/40
See application file for complete search history.

(56) References Cited

U.S. PATENT DOCUMENTS

| | | | |
|---|---|---|---|
| 2014/0024180 A1* | 1/2014 | Choi | C23C 16/308 |
| | | | 438/127 |
| 2014/0209877 A1* | 7/2014 | Lee | H01L 29/78603 |
| | | | 257/40 |
| 2016/0111684 A1* | 4/2016 | Savas | C23C 16/308 |
| | | | 257/40 |
| 2017/0047549 A1* | 2/2017 | Kamiya | H01L 51/5234 |

FOREIGN PATENT DOCUMENTS

| KR | 20130117510 A | 10/2013 |
|---|---|---|
| KR | 20160096264 A | 8/2016 |
| KR | 20160127520 A | 11/2016 |

\* cited by examiner

FILM FOR PREVENTING HUMIDITY FROM PERCOLATION AND METHOD FOR MANUFACTURING THE SAME

TECHNICAL FIELD

The present inventive concept relates a moisture prevention film, and more particularly, to a moisture prevention film applied to an organic light emitting device and a method of manufacturing the same.

BACKGROUND ART

Organic light emitting devices are devices which have a structure where a light emitting layer is provided between a cathode injecting an electron and an anode injecting a hole and in which when the electron supplied from the cathode and the hole supplied from the anode are injected into the light emitting layer, the electron and the hole are combined to generate an exciton, and the generated exciton is shifted from an excited state to a ground state to emit light.

In the organic light emitting devices, if moisture penetrates into the light emitting layer, the light emitting layer is easily deteriorated, and for this reason, a device characteristic is reduced, and lifetime is shortened. Therefore, a moisture prevention film for preventing moisture from penetrating into the light emitting layer is provided on a top of each of the organic light emitting devices.

Hereinafter, a related art organic light emitting device will be described with reference to the drawing.

FIG. 1 is a schematic cross-sectional view of a related art organic light emitting device.

As seen in FIG. 1, the related art organic light emitting device includes a substrate 1, a light emitting part 2, and a moisture prevention film 3.

The light emitting part 2 is provided on the substrate 1. The light emitting part 2 includes an anode, a cathode, and an organic light emitting layer provided between the anode and the cathode.

The moisture prevention film 3 is provided on the light emitting part 2 to prevent moisture from penetrating into the light emitting part 2.

The related art organic light emitting device uses an inorganic insulating material as a material of the moisture prevention film 3, but since there is a limitation in a process of forming the moisture prevention film 3, a moisture prevention effect is reduced.

The inorganic insulating material is formed through a chemical vapor deposition (CVD) process. However, when a defect such a pin hole occurs in a thin film in the deposition process, the thin film grows, and for this reason, the defect such as the pin hole grows together. That is, since the defect such as the pin hole is continuously formed from a lower portion to an upper portion of the moisture prevention film 3, external moisture can easily penetrate into the light emitting part 2 through an area where the defect occurs, causing a problem where the light emitting part 2 is easily deteriorated.

Moreover, in a case where the inorganic insulating material is deposited through an atomic layer deposition (ALD) process, a moisture anti-penetration effect is enhanced, but a deposition rate is reduced, causing a reduction in productivity.

DISCLOSURE

Technical Problem

The present inventive concept is devised to solve the above-described problems of the related art, and an object of the present inventive concept is to provide a moisture prevention film, a method of manufacturing the same, and an organic light emitting device including the moisture prevention film, in which a defect such as a pin hole is prevented from being continuously formed from a lower portion to an upper portion, and thus, a moisture anti-penetration effect is good and a deposition rate is enhanced, thereby enhancing productivity.

Technical Solution

To accomplish the object, the present inventive concept provides a moisture prevention film including: a first moisture prevention film; a second moisture prevention film on the first moisture prevention film; and a third moisture prevention film on the second moisture prevention film, wherein a concentration of oxygen (O) of the second moisture prevention film is higher than a concentration of oxygen of each of the first moisture prevention film and the third moisture prevention film.

Moreover, the second moisture prevention film may be lower in concentration of nitrogen (N) than the first moisture prevention film and the third moisture prevention film.

Moreover, a wet etch rate of the second moisture prevention film may be higher than a wet etch rate of each of the first moisture prevention film and the third moisture prevention film, and the wet etch rate of the second moisture prevention film may be 10 to 100 times higher than the wet etch rate of each of the first moisture prevention film and the third moisture prevention film.

Moreover, a thickness of the second moisture prevention film may be less than a thickness of each of the first moisture prevention film and the third moisture prevention film, a crystallized layer may not be formed between the first moisture prevention film and the second moisture prevention film, and a crystallized layer may not be formed between the second moisture prevention film and the third moisture prevention film.

The present inventive concept also provides an organic light emitting device including: a substrate; a light emitting part on the substrate; and a moisture prevention film on the light emitting part, wherein in the moisture prevention film, a concentration of oxygen (O) included in the moisture prevention film from a lower portion to an upper portion of the moisture prevention film increases gradually and then decreases, and a concentration of nitrogen (N) decreases gradually and then increases.

Moreover, the moisture prevention film may be formed of a single layer, and the concentration of the oxygen and the concentration of the nitrogen may be gradually changed in the moisture prevention film.

The present inventive concept also provides a method of manufacturing a moisture prevention film, the method including: a first moisture prevention film forming process of forming a first moisture prevention film through a chemical vapor deposition process; a second moisture prevention film forming process of forming a second moisture prevention film on the first moisture prevention film through an atomic layer deposition process; and a third moisture prevention film forming process of forming a third moisture prevention film on the second moisture prevention film through a chemical vapor deposition process.

Moreover, the first moisture prevention film to the third moisture prevention film may be formed in one chamber.

Moreover, the second moisture prevention film may be formed through a reaction of a source gas including silicon (Si) with a second reactant gas including nitrous oxide ($N_2O$), and the first moisture prevention film and the third moisture prevention film may each be formed through a reaction of a source gas including silicon (Si) with a first reactant gas including ammonia ($NH_3$) and nitrogen ($N_2$).

Moreover, a deposition rate of the second moisture prevention film may be lower than a deposition rate of each of the first moisture prevention film and the third moisture prevention film, and the deposition rate of the second moisture prevention film may be 4 to 10 times lower than the deposition rate of each of the first moisture prevention film and the third moisture prevention film.

Moreover, the method may further include a seasoning process before only the first moisture prevention film forming process.

The present inventive concept also provides a method of manufacturing a moisture prevention film, the method including a first process of forming a film through a reaction of a source gas including silicon with the first reactant gas including ammonia ($NH_3$) and nitrogen ($N_2$), a second process of forming a film through a reaction of a source gas including silicon (Si) with the second reactant gas including nitrous oxide ($N_2O$), and a third process of forming a film through a reaction of the source gas including silicon with the first reactant gas including ammonia ($NH_3$) and nitrogen ($N_2$).

Advantageous Effect

According to the present inventive concept, the following effects are obtained.

Since a moisture prevention film according to an embodiment of the present inventive concept is formed by a CVD process and an ALD process, a defect such as a pin hole provided in a first moisture prevention film can be cured in a second moisture prevention film, and thus, a moisture anti-penetration effect can be enhanced and a deposition rate can be enhanced, thereby enhancing productivity.

Moreover, in the moisture prevention film according to an embodiment of the present inventive concept, since the CVD process and the ALD process may be performed in one chamber, a separate process of venting vacuum and a seasoning process are not needed, and thus, a process time is reduced, thereby enhancing productivity. Also, in a case where the moisture prevention film formed by the CVD process and the ALD process is loaded into a separate chamber, particles and/or the like can occur. On the other hand, according to the present inventive concept, the amount of generated particles can be reduced, thereby enhancing moisture anti-penetration effect.

MODE FOR INVENTION

Figure 1:
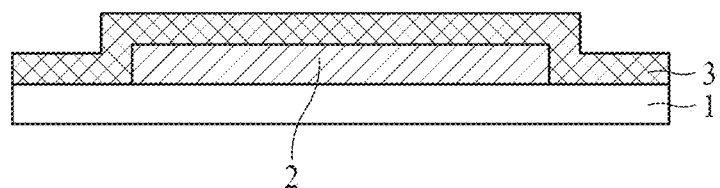
FIG. 1 is a schematic cross-sectional view of a related art organic light emitting device.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. Further, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known function or configuration is determined to unnecessarily obscure the important point of the present inventive concept, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, exemplary embodiments of the present inventive concept will be described in detail with reference to the accompanying drawings.

Figure 2:
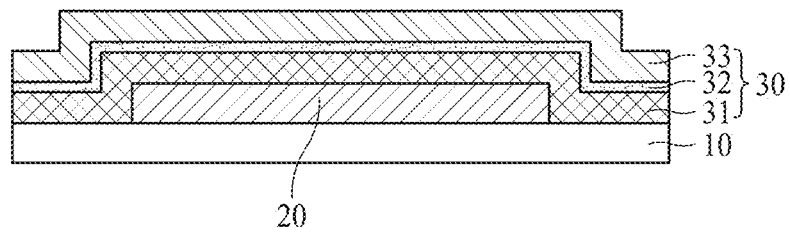
FIG. 2 is a schematic cross-sectional view of an organic light emitting device according to an embodiment of the present inventive concept.

FIG. 2 is a schematic cross-sectional view of an organic light emitting device according to an embodiment of the present inventive concept.

With reference to FIG. 2, the organic light emitting device according to an embodiment of the present inventive concept may include a substrate 10, a light emitting part 20, and a moisture prevention film 30.

The substrate 10 may be formed of glass or plastic.

The light emitting part 20 is formed on one surface (for example, a top of the substrate 10) of the substrate 10. The light emitting part 20 includes a first electrode, an organic light emitting layer, and a second electrode. The first electrode may be formed as an anode such as indium tin oxide (ITO). The organic light emitting layer may be formed of a combination of a hole injecting layer, a hole transporting layer, a light emitting layer, an electron transporting layer, and an electron injecting layer which are sequentially stacked on a top of the first electrode, but is not limited thereto. The second electrode may be formed as a cathode such as silver (Ag) or aluminum (Al) stacked on a top of the organic light emitting layer. A detailed structure of the light emitting part 20 and a process of forming the light emitting part 20 may be changed to various structures and processes known to those skilled in the art.

Although not shown, a thin film transistor is additionally formed between the substrate 10 and the light emitting part 20, and thus, emission of light from the light emitting part 20 may be adjusted by the thin film transistor. As described above, the organic light emitting device including the thin film transistor may be used as a display device which displays an image.

The moisture prevention film 30 includes a first moisture prevention film 31, a second moisture prevention film 32, and a third moisture prevention film 33.

The first moisture prevention film 31 is formed on a top of the light emitting part 20. The first moisture prevention film 31 may be formed of a silicon (Si)-based insulating material. The first moisture prevention film 31 may be formed by a chemical vapor deposition (CVD) process. The first moisture prevention film 31 may be formed through a reaction of a source gas including silicon (Si) with a first reactant gas including ammonia ($NH_3$) and nitrogen ($N_2$). The source gas including silicon may consist of at least one gas of silane ($SiH_4$), disilane ($Si_2H_6$), trisilane ($Si_3H_8$), tetraethylorthosilicate (TEOS), dichlorosilane (DCS), hexachlorosilane (HCD), tri-dimethylaminosilane (TriDMAS), trisilylamine (TSA), and a gas consisting of hexamethyldisiloxane (HMDSO) and hexamethyldisilazane (HMDSN), but is not limited thereto. Since the first moisture prevention film 31 is formed through the reaction of the source gas including silicon (Si) with the first reactant gas including ammonia ($NH_3$) and nitrogen ($N_2$), a concentration of nitrogen (N) of the first moisture prevention film 31 may be high.

The second moisture prevention film 32 is formed on a top of the first moisture prevention film 31. The second moisture prevention film 32 may be formed of a silicon (Si)-based insulating material. The second moisture prevention film 32 may be formed by an atomic layer deposition (ALD) process. The second moisture prevention film 32 may be formed through a reaction of a source gas including silicon (Si) with a second reactant gas including nitrous oxide ($N_2O$). Since the second moisture prevention film 32 is formed through the reaction of the source gas including silicon (Si) with the second reactant gas including nitrous oxide ($N_2O$), a concentration of oxygen (O) of the second moisture prevention film 32 may be high.

The third moisture prevention film 33 is formed on a top of the second moisture prevention film 32. The third moisture prevention film 33 may be formed of a silicon (Si)-based insulating material. The third moisture prevention film 33 may be formed by a chemical vapor deposition (CVD) process. The third moisture prevention film 33 may be formed through a reaction of a source gas including silicon (Si) with the first reactant gas including ammonia ($NH_3$) and nitrogen ($N_2$). Since the third moisture prevention film 33 is formed through the reaction of the source gas including silicon (Si) with the first reactant gas including ammonia ($NH_3$) and nitrogen ($N_2$), a concentration of nitrogen (N) of the third moisture prevention film 33 may be high.

Therefore, the second moisture prevention film 31 may be formed on the first moisture prevention film 31, the third moisture prevention film 33 may be formed on the second moisture prevention film 32, and a concentration of oxygen of the second moisture prevention film 32 may be higher than a concentration of oxygen of each of the first moisture prevention film 31 and the third moisture prevention film 33. Also, a concentration of nitrogen of the second moisture prevention film 32 may be lower than a concentration of nitrogen of each of the first moisture prevention film 31 and the third moisture prevention film 33.

A thickness of the second moisture prevention film 32 may be less than that of each of the first moisture prevention film 31 and the third moisture prevention film 33. Since the second moisture prevention film 32 is formed by the ALD process and the first moisture prevention film 31 and the third moisture prevention film 33 are formed by the CVD process, a longer time can be taken in forming the second moisture prevention film 32. Accordingly, in order to enhance productivity, the thickness of the second moisture prevention film 32 may be set less than that of each of the first moisture prevention film 31 and the third moisture prevention film 33.

A wet etch rate of the second moisture prevention film 32 may be higher than that of each of the first moisture prevention film 31 and the third moisture prevention film 33. In more detail, the wet etch rate of the second moisture prevention film 32 may be 10 to 100 times higher than that of each of the first moisture prevention film 31 and the third moisture prevention film 33.

The wet etch rate denotes a degree to which wet etching is performed per hour, and since the second moisture prevention film 32 has a higher concentration of oxygen and a lower concentration of nitrogen than the first moisture prevention film 31 and the third moisture prevention film 33, the wet etch rate of the second moisture prevention film 32 may be high. In a case where the wet etch rate of the second moisture prevention film 32 is less than 10 times of that of the first moisture prevention film 31 and the third moisture prevention film 33, a moisture anti-penetration ability of the second moisture prevention film 32 can be reduced, and in a case where the wet etch rate of the second moisture prevention film 32 is higher than 100 times of that of the first moisture prevention film 31 and the third moisture prevention film 33, it can be difficult to form the second moisture prevention film 32.

A deposition rate of the second moisture prevention film 32 may be lower than that of each of the first moisture prevention film 31 and the third moisture prevention film 33. In more detail, the deposition rate of the second moisture prevention film 32 may be 4 to 10 times lower than that of each of the first moisture prevention film 31 and the third moisture prevention film 33.

Since the second moisture prevention film 32 is formed by the ALD process, the second moisture prevention film 32 may be lower in deposition rate than the first moisture prevention film 31 and the third moisture prevention film 33 which are formed by the CVD process. In a case where the deposition rate of the second moisture prevention film 32 is less than 4 times of that of each of the first moisture prevention film 31 and the third moisture prevention film 33, the deposition rate of each of the first moisture prevention film 31 and the third moisture prevention film 33 is low, and for this reason, productivity can be reduced. In a case where the deposition rate of the second moisture prevention film 32 is higher than 10 times of that of each of the first moisture prevention film 31 and the third moisture prevention film 33, the deposition rate of the second moisture prevention film 32 is high, and for this reason, moisture anti-penetration ability can be reduced.

The second moisture prevention film 32 may be formed in weaker intensity of plasma than when forming the first moisture prevention film 31 and the third moisture prevention film 33.

Figure 3A:
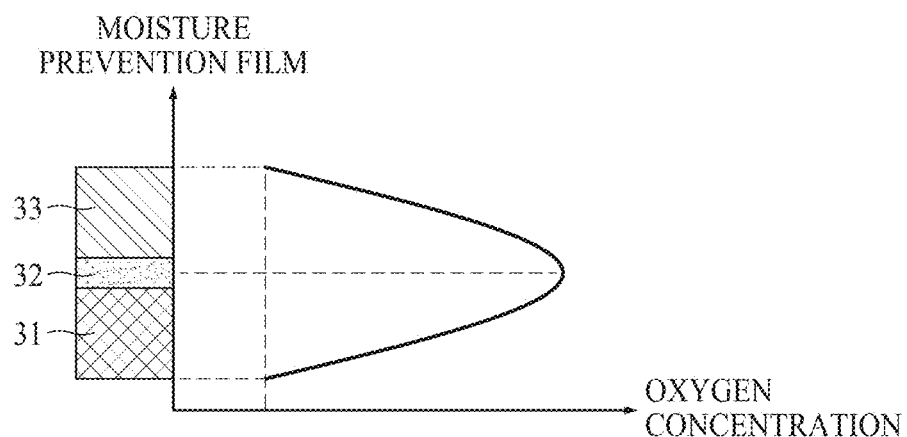
FIG. 3A is a graph showing a concentration of oxygen with respect to a depth of a moisture prevention film according to an embodiment of the present inventive concept.
Figure 3B:
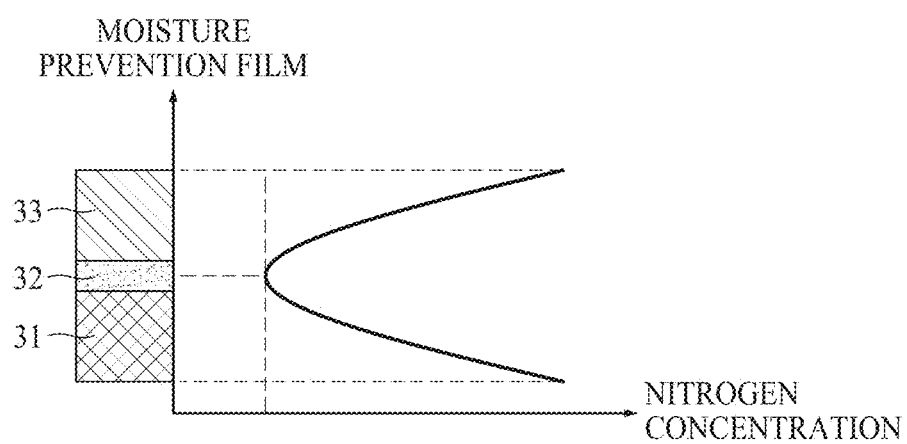
FIG. 3B is a graph showing a concentration of nitrogen with respect to a depth of a moisture prevention film according to an embodiment of the present inventive concept.

FIG. 3A is a graph showing a concentration of oxygen with respect to a depth of the moisture prevention film 30 according to an embodiment of the present inventive concept, and FIG. 3B is a graph showing a concentration of nitrogen with respect to a depth of the moisture prevention film 30 according to an embodiment of the present inventive concept.

With reference to FIGS. 3A and 3B, in a concentration of each of oxygen and nitrogen with respect to the depth of the moisture prevention film 30, a concentration of oxygen of the second moisture prevention film 32 may be the maximum, and a concentration of nitrogen of the second moisture prevention film 32 may be the minimum.

Moreover, in a case where the first moisture prevention film 31 to the third moisture prevention film 33 are formed in one chamber, a crystallized layer may not be formed between the first moisture prevention film 31 and the second moisture prevention film 32 and between the second moisture prevention film 32 and the third moisture prevention film 33. Since the crystallized layer may not be formed between the first moisture prevention film 31 and the second moisture prevention film 32 and between the second moisture prevention film 32 and the third moisture prevention film 33, oxygen and nitrogen are diffused from one moisture prevention film to another moisture prevention film, and thus, a concentration of each of oxygen and nitrogen may be gradually changed without being rapidly changed.

Therefore, in an organic light emitting device including the moisture prevention film 30 according to an embodiment of the present inventive concept, if the moisture prevention film 30 is formed in one chamber, the first moisture prevention film 31 to the third moisture prevention film 33 may be formed like a single layer without a boundary therebetween, and thus, only a concentration of each of oxygen and nitrogen may be changed.

Figure 4A:
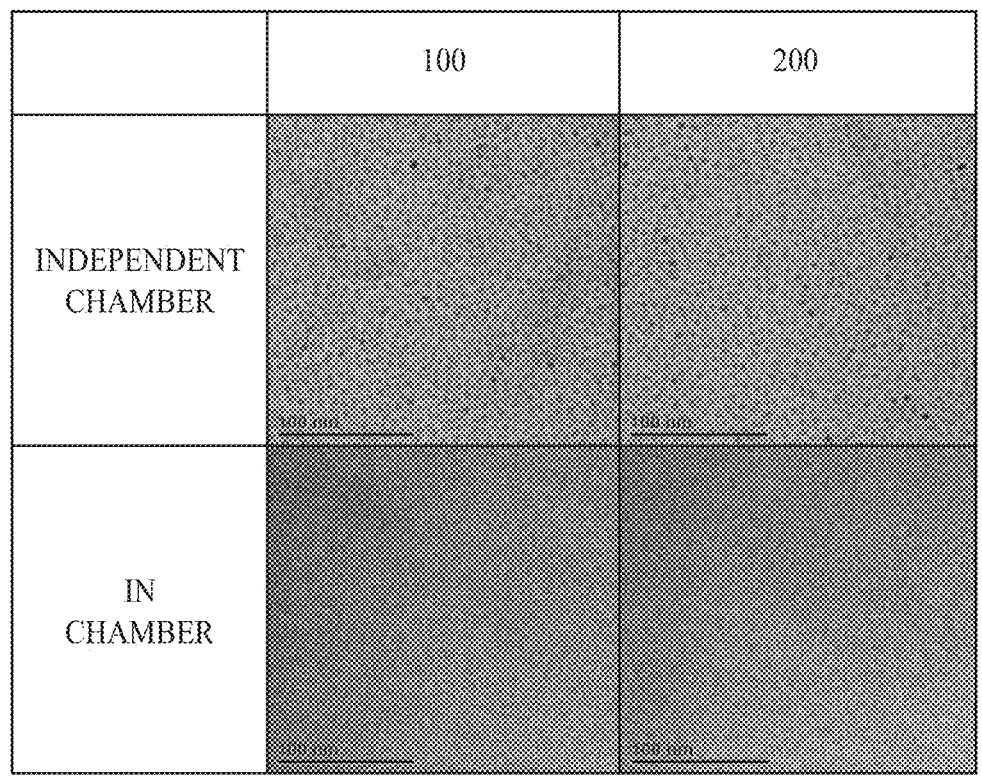
FIG. 4A is a transmission electron microscope (TEM) photograph between moisture prevention films of a moisture prevention film according to an embodiment of the present inventive concept.
Figure 4B:
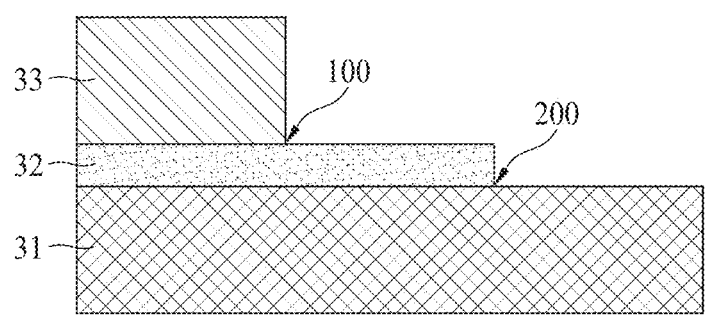
FIG. 4B is a cross-sectional view illustrating a position photographed by a TEM in FIG. 4A.

FIG. 4A is a transmission electron microscope (TEM) photograph between moisture prevention films of the moisture prevention film 30 according to an embodiment of the present inventive concept, and FIG. 4B is a cross-sectional view illustrating a position photographed by a TEM in FIG. 4A.

With reference to FIGS. 4A and 4B, a photograph of a cross-sectional surface which is photographed by the TEM in an area 200 between the first moisture prevention film 31 and the second moisture prevention film 32 and an area 100 between the second moisture prevention film 32 and the third moisture prevention film 33 can be confirmed in FIG. 4B.

Therefore, it can be confirmed that in a case where the first moisture prevention film 31 and the second moisture prevention film 32 are formed in independent chambers (i.e., separate chambers), crystallization is performed in a boundary between the first moisture prevention film 31 and the second moisture prevention film 32. Accordingly, it can be confirmed that since the crystallization is performed in the boundary between the first moisture prevention film 31 and the second moisture prevention film 32, the crystallization is shown like small dots. On the other hand, it can be confirmed that in a case where the first moisture prevention film 31 and the second moisture prevention film 32 are formed in an in chamber (i.e., one chamber), the crystallization is not performed in the boundary between the first moisture prevention film 31 and the second moisture prevention film 32. Accordingly, since the crystallization is not performed in the boundary between the first moisture prevention film 31 and the second moisture prevention film 32, the small dots are not confirmed unlike the case where the first moisture prevention film 31 and the second moisture prevention film 32 are formed in the separate chambers.

Figure 5:
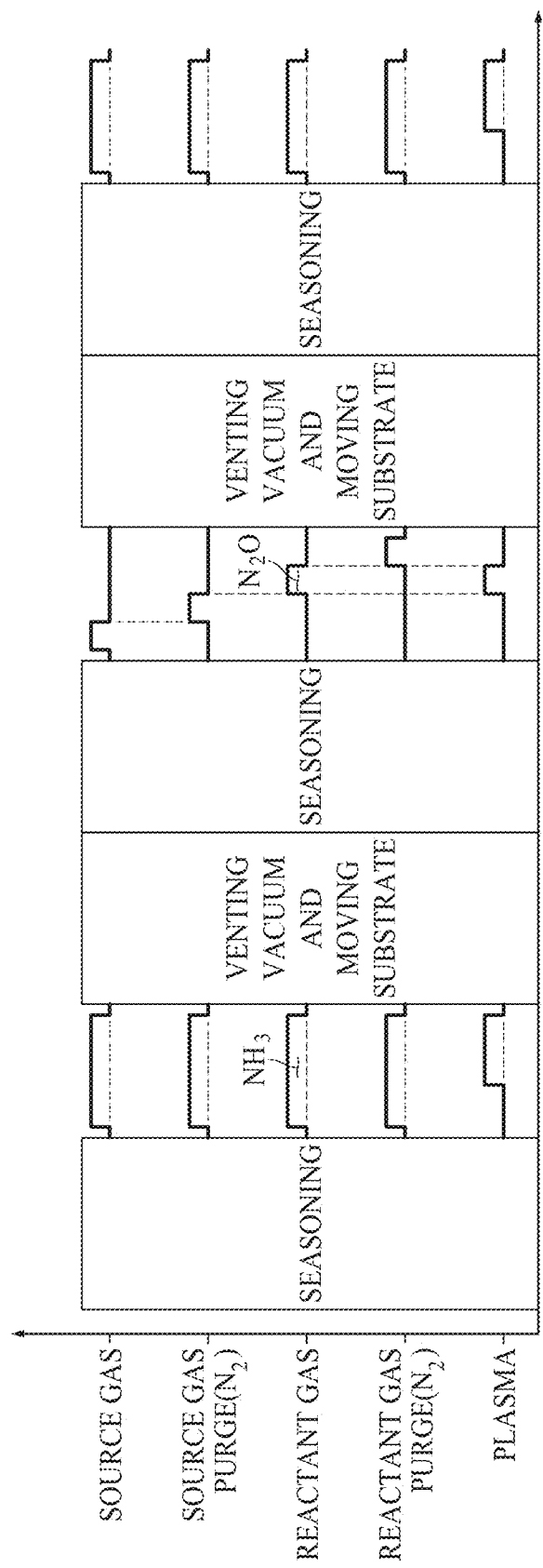
FIG. 5 is a graph showing a process flowchart when a process is performed in separate chambers.
Figure 6:
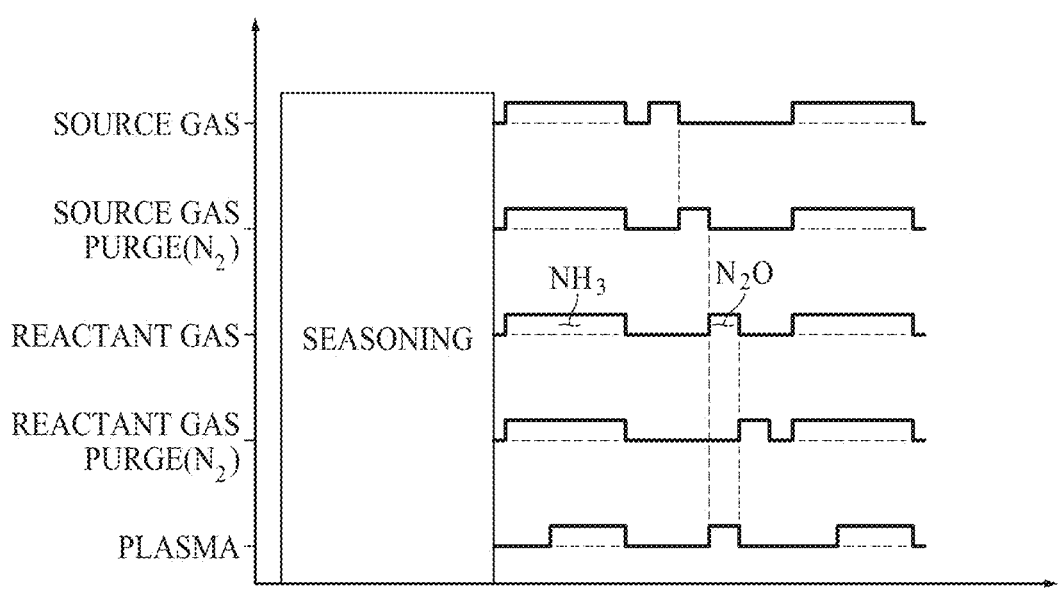
FIG. 6 is a graph showing a process flowchart when a process is performed in one chamber according to an embodiment of the present inventive concept.

FIG. 5 is a graph showing a process flowchart when a process is performed in separate chambers, and FIG. 6 is a graph showing a process flowchart when a process is performed in one chamber according to an embodiment of the present inventive concept.

With reference to FIGS. 5 and 6, FIG. 5 illustrates an example where the first moisture prevention film 31 to the third moisture prevention film 33 are all formed in different chambers, and FIG. 6 illustrates an example where the first moisture prevention film 31 to the third moisture prevention film 33 are formed in the same chamber.

In FIG. 5, first, a seasoning process may be performed, and then, the first moisture prevention film 31 may be formed on the substrate 10, on which the light emitting part 20 is formed, in a first chamber through a CVD process. The first moisture prevention film 31 may be formed through a reaction of a source gas including silicon with the first reactant gas including ammonia ($NH_3$) and nitrogen ($N_2$).

After the first moisture prevention film 31 is formed on the substrate 10, vacuum may be vented for moving the substrate 10 from the first chamber to a second chamber, and the substrate 10 may move. A seasoning process may be again performed in the second chamber before moving the substrate 10 to the second chamber, and the second moisture prevention film 32 may be formed through an ALD process in the second chamber. The second moisture prevention film 32 may be formed through a reaction of a source gas including silicon (Si) with the second reactant gas including nitrous oxide ($N_2O$). The second moisture prevention film 32 may be formed on the first moisture prevention film 31. While the first moisture prevention film 31 is being moved from the first chamber to the second chamber, crystallization may be performed on a film surface of the first moisture prevention film 31. The second moisture prevention film 32 may be formed in the second chamber, and then the substrate 10 may move to the first chamber again.

A vacuum of the second chamber may be vented for moving the substrate 10, on which the second moisture prevention film 32 is formed, to the first chamber again. A seasoning process may be performed in the first chamber before moving the substrate 10 to the first chamber. Subsequently, the third moisture prevention film 33 may be formed on the substrate 10 in the first chamber. The third moisture prevention film 33 may be formed through a reaction of a source gas including silicon with the first reactant gas including ammonia ($NH_3$) and nitrogen ($N_2$). The third moisture prevention film 33 may be formed on the second moisture prevention film 32. While the second moisture prevention film 32 is being moved from the second chamber to the first chamber, crystallization may be performed on a film surface of the second moisture prevention film 32.

On the other hand, in FIG. 6, in a case where the first moisture prevention film 31 to the third moisture prevention film 33 are formed in one chamber, a seasoning process and a vacuum venting process necessary for moving the substrate 10 may not be needed. Therefore, in a case where the first moisture prevention film 31 to the third moisture prevention film 33 are formed in one chamber, a process time and the number of processes are reduced, thereby enhancing productivity. Also, the seasoning process may be performed before only an operation of forming the first moisture prevention film 31.

Moreover, the moisture prevention film 30 may be formed through a first process of forming a film through a reaction of a source gas including silicon with the first reactant gas including ammonia ($NH_3$) and nitrogen ($N_2$), a second process of forming a film through a reaction of a source gas including silicon (Si) with the second reactant gas including nitrous oxide ($N_2O$), and a third process of forming a film through a reaction of a source gas including silicon with the first reactant gas including ammonia ($NH_3$) and nitrogen ($N_2$).

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

The invention claimed is:

1. A moisture prevention film comprising:
a film stack including:
  a first moisture prevention film;
  a second moisture prevention film on the first moisture prevention film; and
  a third moisture prevention film on the second moisture prevention film,
wherein a concentration of oxygen (O) of the second moisture prevention film is higher than a concentration of oxygen of each of the first moisture prevention film and the third moisture prevention film, and
wherein in the film stack, a concentration of oxygen (O) included in the film stack from a lower portion to an upper portion of the film stack increases gradually and then decreases, and a concentration of nitrogen (N) decreases gradually and then increases.

2. The moisture prevention film of claim 1, wherein the second moisture prevention film is lower in concentration of nitrogen (N) than the first moisture prevention film and the third moisture prevention film.

3. The moisture prevention film of claim 1, wherein a wet etch rate of the second moisture prevention film is higher than a wet etch rate of each of the first moisture prevention film and the third moisture prevention film.

4. The moisture prevention film of claim 3, wherein the wet etch rate of the second moisture prevention film is 10 to 100 times higher than the wet etch rate of each of the first moisture prevention film and the third moisture prevention film.

5. The moisture prevention film of claim 1, wherein a thickness of the second moisture prevention film is less than a thickness of each of the first moisture prevention film and the third moisture prevention film.

6. The moisture prevention film of claim 1, wherein a crystallized layer is not formed between the first moisture prevention film and the second moisture prevention film.

7. The moisture prevention film of claim 1, wherein a crystallized layer is not formed between the second moisture prevention film and the third moisture prevention film.

8. An organic light emitting device comprising:
a substrate;
a light emitting part on the substrate; and
a moisture prevention film on the light emitting part,
wherein in the moisture prevention film, a concentration of oxygen (O) included in the moisture prevention film from a lower portion to an upper portion of the moisture prevention film increases gradually and then decreases, and a concentration of nitrogen (N) decreases gradually and then increases.

9. The organic light emitting device of claim 8, wherein the moisture prevention film is formed of a single layer, and the concentration of the oxygen and the concentration of the nitrogen are gradually changed in the moisture prevention film.

10. A method of manufacturing a moisture prevention film, the method comprising:
a first moisture prevention film forming process of forming a first moisture prevention film through a chemical vapor deposition process;
a second moisture prevention film forming process of forming a second moisture prevention film on the first moisture prevention film through an atomic layer deposition process; and
a third moisture prevention film forming process of forming a third moisture prevention film on the second moisture prevention film through a chemical vapor deposition process, and
wherein a deposition rate of the second moisture prevention film is lower than a deposition rate of each of the first moisture prevention film and the third moisture prevention film.

11. The method of claim 10, wherein the first moisture prevention film to the third moisture prevention film are formed in one chamber.

12. The method of claim 10, wherein the second moisture prevention film is formed through a reaction of a source gas including silicon (Si) with a second reactant gas including nitrous oxide (N2O).

13. The method of claim 10, wherein the first moisture prevention film and the third moisture prevention film are each formed through a reaction of a source gas including silicon (Si) with a first reactant gas including ammonia (NH3) and nitrogen (N2).

14. The method of claim 10, wherein the deposition rate of the second moisture prevention film is 4 to 10 times lower than the deposition rate of each of the first moisture prevention film and the third moisture prevention film.

15. The method of claim 10, further comprising a seasoning process before only the first moisture prevention film forming process.

16. A method of manufacturing a moisture prevention film, the method comprises;
- a first process of forming a film through a reaction of a source gas including silicon with a first reactant gas including ammonia (NH3) and nitrogen (N2);
- a second process of forming a film through a reaction of a source gas including silicon (Si) with a second reactant gas including nitrous oxide (N2O); and
- a third process of forming a film through a reaction of the source gas including silicon with the first reactant gas including ammonia (NH3) and nitrogen (N2),
- wherein a deposition rate of the film formed in the second process is lower than a deposition rate of each of the films formed in the first process and the third process.

* * * * *